(12) United States Patent
Ueda et al.

(10) Patent No.: US 9,249,336 B2
(45) Date of Patent: Feb. 2, 2016

(54) CURABLE COMPOSITION FOR INKJET, AND METHOD FOR PRODUCING ELECTRONIC COMPONENT

(75) Inventors: Michihisa Ueda, Osaka (JP); Takashi Watanabe, Osaka (JP); Shigeru Nakamura, Osaka (JP); Shuuji Kage, Osaka (JP); Toshio Takahashi, Osaka (JP); Takanori Inoue, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 71 days.

(21) Appl. No.: 13/825,412

(22) PCT Filed: Sep. 20, 2011

(86) PCT No.: PCT/JP2011/071335
§ 371 (c)(1),
(2), (4) Date: Apr. 30, 2013

(87) PCT Pub. No.: WO2012/039379
PCT Pub. Date: Mar. 29, 2012

(65) Prior Publication Data
US 2013/0208064 A1    Aug. 15, 2013

(30) Foreign Application Priority Data
Sep. 22, 2010 (JP) ................. 2010-212265

(51) Int. Cl.
| | | |
|---|---|---|
| B41J 2/01 | (2006.01) | |
| G01D 11/00 | (2006.01) | |
| C09D 163/00 | (2006.01) | |
| B41M 5/00 | (2006.01) | |
| C09D 11/101 | (2014.01) | |
| H05K 3/34 | (2006.01) | |
| C08G 59/40 | (2006.01) | |
| C09D 11/30 | (2014.01) | |
| B41M 7/00 | (2006.01) | |
| H05K 3/12 | (2006.01) | |

(52) U.S. Cl.
CPC ........... C09D 163/00 (2013.01); B41M 5/0023 (2013.01); B41M 7/009 (2013.01); C08G 59/4021 (2013.01); C09D 11/101 (2013.01); C09D 11/30 (2013.01); H05K 3/3452 (2013.01); B41M 7/0072 (2013.01); H05K 3/125 (2013.01); H05K 2203/013 (2013.01)

(58) Field of Classification Search
USPC ..................... 347/102; 522/170, 39
See application file for complete search history.

(56) References Cited

U.S. PATENT DOCUMENTS

| | | | | |
|---|---|---|---|---|
| 4,279,717 A | * | 7/1981 | Eckberg et al. | 522/31 |
| H0000304 H | * | 7/1987 | Vorrier et al. | 522/92 |
| 4,814,365 A | * | 3/1989 | Takiyama et al. | 523/514 |
| 4,929,494 A | * | 5/1990 | Matsui et al. | 442/136 |
| 4,977,198 A | * | 12/1990 | Eckberg | 522/25 |
| 5,021,465 A | * | 6/1991 | Takiyama et al. | 522/60 |
| 6,069,187 A | * | 5/2000 | Kusumoto | C08F 220/28 522/104 |
| 6,433,035 B1 | * | 8/2002 | Grinevich et al. | 522/2 |
| 6,602,929 B1 | * | 8/2003 | Ohba et al. | 522/97 |
| 7,214,431 B2 | * | 5/2007 | Komiya | C03C 25/106 385/147 |
| 2004/0180226 A1 | * | 9/2004 | Chatterjee et al. | 428/458 |
| 2005/0072519 A1 | | 4/2005 | Johnson et al. | |
| 2006/0058412 A1 | | 3/2006 | Kakinuma et al. | |
| 2007/0256781 A1 | | 11/2007 | Johnson et al. | |
| 2009/0163615 A1 | | 6/2009 | Halahmi et al. | |
| 2011/0293891 A1 | * | 12/2011 | Leyden et al. | 428/172 |

FOREIGN PATENT DOCUMENTS

| | | |
|---|---|---|
| CN | 1485356 A | 3/2004 |
| CN | 1894626 A | 1/2007 |
| JP | 59-126428 A | 7/1984 |
| JP | 63-205313 A | 8/1988 |
| JP | 2-283718 A | 11/1990 |
| JP | 5-78454 A | 3/1993 |
| JP | 2000-239418 A | 9/2000 |
| JP | 2001-220526 A | 8/2001 |
| JP | 2005-68280 A | 3/2005 |
| JP | 2009-506187 A | 2/2009 |
| JP | 2010-59299 A | 3/2010 |
| JP | 2010-111716 A | 5/2010 |
| JP | 2010-143982 A | 7/2010 |
| JP | 2011-21079 A | 2/2011 |
| JP | 2011-26403 A | 2/2011 |
| TW | 201024380 A1 | 7/2010 |
| WO | WO-2004/099272 A1 | 11/2004 |

OTHER PUBLICATIONS

The First Office Action for the Application No. 201180045640.9 from The State Intellectual Property Office of the People's Republic of China dated Jan. 24, 2014.

(Continued)

*Primary Examiner* — Julian Huffman
*Assistant Examiner* — Leonard S Liang
(74) *Attorney, Agent, or Firm* — Cheng Law Group, PLLC

(57) ABSTRACT

Provided is a curable composition for inkjet capable of improving uniformity of a cured product film and heat resistance of a cured product. The curable composition for inkjet according to the present invention contains a compound having a (meth)acryloyl group and a cyclic ether group, a photoreactive compound, a compound having a cyclic ether group, a photopolymerization initiator, and a potential curing agent, the photoreactive compound and the compound having a cyclic ether group each are a compound other than the compound having a (meth)acryloyl group and a cyclic ether group, the compound having a (meth)acryloyl group and a cyclic ether group has one or two (meth)acryloyl groups, and the viscosity at 25° C. of the curable composition for inkjet according to the present invention is 160 mPa·s or more and 1200 mPa·s or less.

10 Claims, No Drawings

(56) References Cited

OTHER PUBLICATIONS

International Search Report for the Application No. PCT/JP2011/071335 mailed Dec. 27, 2011.
Written Opinion of the International Searching Authority (PCT/ISA/237) for the Application No. PCT/JP2011/071335 mailed Dec. 27, 2011.
Written Opinion of the International Searching Authority (PCT/ISA/237) for the Application No. PCT/JP2011/071335 mailed Dec. 27, 2011 (English Translation mailed Apr. 25, 2013).
The Second Office Action for the Application No. 201180045640.9 from The State Intellectual Property Office of the People's Republic of China dated Sep. 2, 2014.

* cited by examiner

CURABLE COMPOSITION FOR INKJET, AND METHOD FOR PRODUCING ELECTRONIC COMPONENT

TECHNICAL FIELD

The present invention relates to a curable composition for inkjet that is applied by an inkjet method, and a curable composition for inkjet suitably used for forming a cured product layer such as a resist pattern on a substrate, and a method for producing an electronic component having a cured product layer formed of the curable composition for inkjet.

BACKGROUND ART

Conventionally, a printed wiring board in which a solder resist pattern which is a patterned solder resist film is formed on a substrate having a wiring provided on its top face is widely used. As electronic devices become smaller and densified, a still finer solder resist pattern is demanded in a printed wiring board.

As a method for forming a fine solder resist pattern, a method of applying a composition for solder resist by an inkjet method is proposed. In the inkjet method, the number of steps is reduced in comparison with the case of forming a solder resist pattern by a screen printing method. Therefore, in the inkjet method, it is possible to form a solder resist pattern easily and efficiently.

In the case of applying a composition for solder resist by an inkjet method, the composition is required to have a somewhat low viscosity at the time of application.

A composition for solder resist that is applicable by an inkjet method is disclosed in Patent Document 1 recited below. Patent Document 1 discloses a curable composition for inkjet containing a monomer having a (meth)acryloyl group and a heat curable functional group, a photoreactive diluent having a weight average molecular weight of 700 or less, and a photopolymerization initiator. The viscosity at 25° C. of the curable composition for inkjet is 150 mPa·s or less.

PRIOR ART DOCUMENT

Patent Document

Patent Document 1: WO2004/099272A1

SUMMARY OF THE INVENTION

Problems to be Solved by the Invention

The viscosity of the curable composition for inkjet described in Patent Document 1 is relatively low. Therefore, the curable composition for inkjet described in Patent Document 1 can be applied on a substrate by an inkjet method.

However, the curable composition for inkjet described in Patent Document 1 has a problem that heat resistance of the cured product after curing is low. Accordingly, when a printed wiring board is obtained by forming a solder resist pattern on a substrate using the curable composition for inkjet described in Patent Document 1, the printed wiring board cannot bear long term use, or reliability of the printed wiring board can be low because the heat resistance of the solder resist pattern is poor.

Further, in the solder resist pattern in which the curable composition for inkjet described in Patent Document 1 is applied, the photo-cured component that is cured by light and the heat-cured compound that is cured by heat may separate from each other. This leads to the problem of nonuniformity of the solder resist pattern.

It is an object of the present invention to provide a curable composition for inkjet that is applied by an inkjet method, capable of improving uniformity of a cured product film after curing, and improving heat resistance of a cured product, and a method for producing an electronic component applied the curable composition for inkjet.

Means for Solving the Problems

According to a broad aspect of the present invention, there is provided a curable composition for inkjet that is applied by an inkjet method, and is able to cure by light irradiation and heat addition, including a compound having a (meth)acryloyl group and a cyclic ether group, a photoreactive compound other than the compound having a (meth)acryloyl group and a cyclic ether group, a photopolymerization initiator, a compound having a cyclic ether group other than the compound having a (meth)acryloyl group and a cyclic ether group, and a potential curing agent, wherein the compound having a (meth)acryloyl group and a cyclic ether group has one or two (meth)acryloyl groups and the viscosity at 25° C. measured in conformance with JIS K2283 is 160 mPa·s or more and 1200 mPa·s or less.

In a specific aspect of the curable composition for inkjet according to the present invention, the compound having a (meth)acryloyl group and a cyclic ether group is at least one selected from the group consisting of glycidyl(meth)acrylate, 3,4-epoxycyclohexylmethyl(meth)acrylate, 4-hydroxybutyl (meth)acrylate glycidyl ether, and a reaction product of an epoxy compound and (meth)acrylic acid.

In 100% by weight of the curable composition for inkjet according to the present invention, a total content of the compound having a (meth)acryloyl group and a cyclic ether group and the compound having a cyclic ether group is preferably 15% by weight or more and 50% by weight or less.

The photopolymerization initiator is preferably an α-aminoalkylphenone type photoradical polymerization initiator. The photopolymerization initiator is preferably an α-aminoalkylphenone type photoradical polymerization initiator having a dimethyl amino group.

In other specific aspect of the curable composition for inkjet according to the present invention, the potential curing agent is a reaction viscous product obtained by reacting dicyandiamide with a functional group-containing compound having a functional group capable of reacting with the dicyandiamide.

In another specific aspect of the curable composition for inkjet according to the present invention, the photoreactive compound includes a multifunctional compound having a polycyclic backbone and having two or more (meth)acryloyl groups.

In yet another specific aspect of the curable composition for inkjet according to the present invention, the photoreactive compound includes a monofunctional compound having a polycyclic backbone and having one (meth)acryloyl group.

In still another specific aspect of the curable composition for inkjet according to the present invention, the photoreactive compound includes both a multifunctional compound having a polycyclic backbone and having two or more (meth)acryloyl groups, and a monofunctional compound having a polycyclic backbone and having one (meth)acryloyl group.

According to a broad aspect of the present invention, there is provided a method for producing an electronic component including the steps of: applying a curable composition for inkjet produced according to the present invention to draw a pattern, and making the curable composition for inkjet drawn into a pattern cure by light irradiation and heat addition, to form a cured product layer.

In a specific aspect of the method for producing an electronic component according to the present invention is a method for producing a printed wiring board which is an electronic component having a resist pattern, wherein the curable composition for inkjet is applied by an inkjet method and drawn into a pattern, and the curable composition for inkjet drawn into a pattern is made to cure by light irradiation and heat addition, to form a resist pattern.

Effect of the Invention

Since the curable composition for inkjet according to the present invention includes a compound having a (meth)acryloyl group and a cyclic ether group, a photoreactive compound, a photopolymerization initiator, a compound having a cyclic ether group, and a potential curing agent, it will cure by light irradiation and heat addition. Further, since the curable composition for inkjet according to the present invention has the aforementioned composition, and the viscosity is 160 mPa·s or more and 1200 mPa·s or less, it is applicable by an inkjet method. Further, since the curable composition for inkjet according to the present invention has the aforementioned composition, and the compound having a (meth)acryloyl group and a cyclic ether group has one or two (meth) acryloyl groups, it is possible to improve the heat resistance of the cured product after curing. Further, in the curable composition for inkjet according to the present invention, it is possible to improve the uniformity of the cured product film after curing.

MODE(S) FOR CARRYING OUT THE INVENTION

In the following, details of the present invention will be described.

(Curable Composition for Inkjet)

The curable composition for inkjet according to the present invention contains a compound having a (meth)acryloyl group and a cyclic ether group (A), a photoreactive compound (B), a photopolymerization initiator (C), a compound having a cyclic ether group (D), and a potential curing agent (E). The photoreactive compound (B) is a photoreactive compound other than the compound having a (meth)acryloyl group and a cyclic ether group (A). The compound having a cyclic ether group (D) is a compound having a cyclic ether group other than the compound having a (meth)acryloyl group and a cyclic ether group (A). The compound having a (meth)acryloyl group and a cyclic ether group (A) has one or more (meth)acryloyl groups. The term "(meth)acryloyl group" indicates an acryloyl group and a methacryloyl group.

Since the curable composition for inkjet according to the present invention contains the compound having a (meth)acryloyl group and a cyclic ether group (A), the photoreactive compound (B) and the photopolymerization initiator (C), it can cure by light irradiation. Since the curable composition for inkjet according to the present invention contains the compound having a cyclic ether group (D) and the potential curing agent (B), it can also cure by heat addition. Therefore, the curable composition for inkjet according to the present invention is able to cure by light irradiation and heat addition, and is a photo- and heat-curable composition for inkjet. In the curable composition for inkjet according to the present invention, after obtaining a primary cured product by light irradiation, the primary cured product may be made to really cure by heat addition to obtain a resist pattern which is a cured product. By conducting primary curing by light irradiation in the manner as described above, it is possible to prevent the curable composition for inkjet that is applied on an application objective member such as substrate from wet-spreading. Therefore, it is possible to form a cured product layer such as fine resist pattern with high accuracy.

Further the viscosity at 25° C. measured in conformance with JIS K2283 of the curable composition for inkjet according to the present invention is 160 mPa·s or more and 1200 mPa·s or less. Since the curable composition for inkjet according to the present invention has the aforementioned composition and a viscosity falling within the aforementioned range, it can be applied by an inkjet method.

Further, since the curable composition for inkjet according to the present invention contains the compound having a (meth)acryloyl group and a cyclic ether group (A), the photoreactive compound (B), the photopolymerization initiator (C), the compound having a cyclic ether group (D) and the potential curing agent (E), and further the compound (A) has one or two (meth)acryloyl groups, the heat resistance of the cured product can be improved. Therefore, it is possible to use an electronic component such as a printed wiring board in which the curable composition for inkjet according to the present invention is used for a long term, and to improve the reliability of the electronic component.

Further, in the curable composition for inkjet according to the present invention, uniformity of the cured product film after curing can also be improved. For example, by applying the curable composition for inkjet on an application objective member by an inkjet method, and making the composition cure by light irradiation and heat addition, it is possible to obtain a uniform cured product layer such as a resist pattern. Concretely, it is possible to prevent the photo-cured component that is cured by light and the heat-cured compound that is cured by heat from separating from each other, and to hinder occurrence of unevenness in a cured product film such as a resist pattern.

In the following, details of ingredients contained in the curable composition for inkjet according to the present invention will be described.

[Compound Having (Meth)Acryloyl Group and Cyclic Ether Group (A)]

The compound having a (meth)acryloyl group and a cyclic ether group (A) has one or two (meth)acryloyl groups. The compound (A) does not have three or more (meth)acryloyl group. Such a compound itself is conventionally known. The compound having a (meth)acryloyl group and a cyclic ether group (A) may be used singly or in combination of two or more kinds.

The compound having a (meth)acryloyl group and a cyclic ether group (A) may be a compound obtained by converting part of cyclic ether groups in a compound having two or more cyclic ether groups into a (meth)acryloyl group. Even with the use of such a compound, heat resistance of the cured product and uniformity of the cured product film can be improved.

Concrete examples of the compound (A) include glycidyl (meth)acrylate, 3,4-epoxycyclohexylmethyl(meth)acrylate, 4-hydroxybutyl(meth)acrylate glycidyl ether, bisphenol type epoxy(meth)acrylate, cresol novolak type epoxy(meth)acrylate, carboxylic anhydride modified epoxy(meth)acrylate, and phenol novolak type epoxy(meth)acrylate. The term "(meth)acrylate" indicates acrylate and methacrylate.

From the view point of further improving the heat resistance of the cured product and the uniformity of the cured product film, the compound having a (meth)acryloyl group and a cyclic ether group (A) is particularly preferably at least one selected from the group consisting of glycidyl(meth) acrylate, 3,4-epoxycyclohexylmethyl(meth)acrylate, 4-hydroxybutyl(meth)acrylate glycidyl ether, and a reaction product of an epoxy compound and (meth)acrylic acid. The reaction product of an epoxy compound and (meth)acrylic acid is obtained by converting part of epoxy groups in an epoxy compound having two or more epoxy groups into a (meth)acryloyl group. The reaction product of an epoxy compound and (meth)acrylic acid is preferably a compound other than glycidyl(meth)acrylate, 3,4-epoxycyclohexylmethyl (meth)acrylate and 4-hydroxybutyl(meth)acrylate glycidyl ether. The term "(meth)acryl" indicates acryl and methacryl.

The compound (A) is obtained also by letting, for example, a compound having two or more cyclic ether groups (cyclic ether group-containing compound) and (meth)acrylic acid react in the presence of a basic catalyst according to an ordinary method. At this time, part of the two or more cyclic ether groups is converted into a (meth)acryloyl group. The compound having a (meth)acryloyl group and a cyclic ether group (A) is also preferably a compound obtained by converting part of cyclic ether groups in a compound having two or more cyclic ether groups into a (meth)acryloyl group. This compound is also called a partially (meth)acrylated cyclic ether-containing compound. The compound obtained by this reaction generally has a hydroxy group as a result of conversion reaction from a cyclic ether group into a (meth)acryloyl group. The compound having a (meth)acryloyl group and a cyclic ether group (A) preferably has a hydroxy group. The hydroxy group is preferably a hydroxy group generated as a result of conversion of a cyclic ether group into a (meth) acryloyl group.

It is preferred that 20% or more of cyclic ether groups are converted into (meth)acryloyl groups (conversion rate), and partially (meth)acrylated. It is more preferred that 50% of cyclic ether groups are converted into (meth)acryloyl groups.

Examples of the cyclic ether group in the compound (A) include an epoxy group and an oxetanyl group. Among these, the cyclic ether group is preferably an epoxy group from the view point of improving the curability and obtaining a cured product having more excellent heat resistance.

The blending amount of the compound (A) is appropriately adjusted so that it appropriately cures by light irradiation and heat addition, and is not particularly limited. As one example of the blending amount of the compound (A), the content of the compound (A) in 100% by weight of the curable composition for inkjet is preferably 2% by weight or more and 70% by weight or less. In 100% by weight of the curable composition for inkjet, the content of the compound (A) is more preferably 5% by weight or more, further preferably 10% by weight or more, and more preferably 50% by weight or less. In 100% by weight of the curable composition for inkjet, an upper limit of the content of the compound (A) is appropriately adjusted, for example, by contents of the ingredients (B) to (E) and other ingredients.

[Photoreactive Compound (B)]

The photoreactive compound (B) is a photoreactive compound other than the compound having a (meth)acryloyl group and a cyclic ether group (A). The photoreactive compound (B) is curable by light irradiation. The photoreactive compound (B) may have a (meth)acryloyl group. As the photoreactive compound (B), a conventionally known photoreactive compound may be used. The photoreactive compound (B) may be used singly or in combination of two or more kinds.

Preferably the photoreactive compound (B) does not have a cyclic ether group. A photoreactive compound not having a cyclic ether group is different from the compound (A) and the compound (D). Also, the photoreactive compound (B) is preferably a photoreactive compound not having a cyclic ether group but having a (meth)acryloyl group.

Examples of the photoreactive compound (B) include a multifunctional compound having two or more (meth)acryloyl groups, and a monofunctional compound having one (meth)acryloyl group.

Examples of the polyfunctional compound include (meth) acrylic acid adducts of polyhydric alcohol, (meth)acrylic acid adducts of alkylene oxide-modified polyhydric alcohol, urethane(meth)acrylates, and polyester(meth)acrylates. Examples of the polyhydric alcohol include diethylene glycol, triethylene glycol, polyethylene glycol, dipropylene glycol, tripropylene glycol, polypropylene glycol, trimethylolpropane, and pentaerythritol.

Concrete examples of the multifunctional compound among the photoreactive compounds include triethylene glycol di(meth)acrylate, tricyclodecane dimethanol di(meth) acrylate, isobornyl dimethanol di(meth)acrylate and dicyclopentenyl dimethanol di(meth)acrylate.

Concrete examples of the monofunctional compound among the photoreactive compounds include isobornyl (meth)acrylate, dihydroxycyclopentadienyl(meth)acrylate, dicyclopentenyl(meth)acrylate, dicyclopentenyloxyethyl (meth)acrylate, dicyclopentanyl(meth)acrylate and naphthyl (meth)acrylate.

The photoreactive compound (B) preferably includes a compound having a polycyclic backbone and having a (meth) acryloyl group (B1). By the use of the compound (B1), it is possible to improve the moist heat resistance of the cured product of the curable composition for inkjet. Therefore, it is possible to use the printed wiring board applied the curable composition for inkjet according to the present invention for a long time, and to improve the reliability of the printed wiring board.

The compound (B1) is preferably a multifunctional compound having a polycyclic backbone and having two or more (meth)acryloyl groups (B1-1). Therefore, the photoreactive compound (B) preferably includes the multifunctional compound having a polycyclic backbone and having two or more (meth)acryloyl groups (B1-1). The compound (B1) is also preferably a monofunctional compound having a polycyclic backbone and having one (meth)acryloyl group (B1-2). Therefore, the photoreactive compound (B) preferably includes the monofunctional compound having a polycyclic backbone and having one (meth)acryloyl group (B1-2). Among these, from the view point of further improving the moist heat resistance of the cured product, the multifunctional compound having a polycyclic backbone and having two or more (meth)acryloyl groups (B1-1) is preferred.

Further, the photoreactive compound (B) more preferably includes both the multifunctional compound having a polycyclic backbone and having two or more (meth)acryloyl groups (B1-1), and the monofunctional compound having a polycyclic backbone and having one (meth)acryloyl group (B1-2). In these cases, moist heat resistance of the cured product of the curable composition for inkjet is significantly improved. Therefore, it is possible to use an electronic component such as printed wiring board applied the curable composition for inkjet according to the present invention for a longer term, and to further improve the reliability of the electronic component. Further, by using the monofunctional compound (B1-2), not only moist heat resistance of the cured product is increased, but also dischargeability of the curable composition is increased. When the monofunctional compound having a polycyclic backbone and having one (meth)

acryloyl group (B1-2) is used, moist heat resistance of the cured product is increased in comparison with the case where a monofunctional compound not having a polycyclic backbone but having one (meth)acryloyl group is used.

The multifunctional compound (B1-1) is not particularly limited as far as it has a polycyclic backbone and has two or more (meth)acryloyl groups. As the multifunctional compound (B1-1), a conventionally known multifunctional compound having a polycyclic backbone and having two or more (meth)acryloyl groups may be used. Since the multifunctional compound (B1-1) has two or more (meth)acryloyl groups, it cures as polymerization proceeds by light irradiation. The multifunctional compound (B1-1) may be used singly or in combination of two or more kinds.

Examples of the polyfunctional compound (B1-1) include (meth)acrylic acid adducts of polyhydric alcohol, (meth) acrylic acid adducts of alkylene oxide-modified polyhydric alcohol, urethane(meth)acrylates, and polyester (meth)acrylates. Examples of the polyhydric alcohol include diethylene glycol, triethylene glycol, polyethylene glycol, dipropylene glycol, tripropylene glycol, polypropylene glycol, trimethylolpropane, and pentaerythritol.

Concrete examples of the polyfunctional compound (B1-1) include tricyclodecanedimethanol di(meth)acrylate, isobornyldimethanol di(meth)acrylate and dicyclopentenyldimethanol di(meth)acrylate. Among these, the polyfunctional compound (B1-1) is preferably tricyclodecanedimethanol di(meth)acrylate from the view point of further improving moist heat resistance of the cured product. The term "(meth)acrylate" indicates acrylate and methacrylate.

The mono-functional compound (B1-2) is not particularly limited insofar as it has a polycyclic backbone and has one (meth)acryloyl group. As the monofunctional compound (B1-2), a conventionally known monofunctional compound having a polycyclic backbone and having one (meth)acryloyl group may be used. The mono-functional compound (B1-2) may be used singly or in combination of two or more kinds.

Concrete examples of the monofunctional compound (B1-2) include isobornyl(meth)acrylate, dihydroxycyclopentadienyl(meth)acrylate, dicyclopentenyl(meth)acrylate, dicyclopentenyloxyethyl(meth)acrylate, dicyclopentanyl(meth) acrylate and naphthyl(meth)acrylate. Among these, from the view point of further enhancing the moist heat resistance of the cured product, the monofunctional compound (B1-2) is preferably at least one selected from the group consisting of isobornyl(meth)acrylate, dihydroxycyclopentadienyl(meth) acrylate, dicyclopentenyl(meth)acrylate, dicyclopentenyloxyethyl(meth)acrylate and dicyclopentanyl(meth)acrylate.

The "polycyclic backbone" in the compound (B1) indicates a structure sequentially having a plurality of cyclic backbones. As the polycyclic backbone in the compound (B1), a polycyclic alicyclic backbone, a polycyclic aromatic backbone and the like are recited.

Examples of the polycyclic alicyclic backbone include a bicycloalkane backbone, a tricycloalkane backbone, a tetracycloalkane backbone, and an isobornyl backbone.

Examples of the polycyclic aromatic backbone include a naphthalene ring backbone, an anthracene ring backbone, a phenanthrene ring backbone, a tetracene ring backbone, a chrysene ring backbone, a triphenylene ring backbone, a tetraphene ring backbone, a pyrene ring backbone, a pentacene ring backbone, a picene ring backbone and a perylene ring backbone.

The blending amount of the photoreactive compound (B) is appropriately adjusted so that appropriate curing is achieved by light irradiation, and is not particularly limited. As one example of the blending amount of the photoreactive compound (B), the content of the photoreactive compound (B) in 100% by weight of the curable composition for inkjet is preferably 20% by weight or more, more preferably 30% by weight or more, preferably 95% by weight or less, and more preferably 90% by weight or less. In 100% by weight of the curable composition for inkjet, an upper limit of the content of the photoreactive compound (B) is appropriately adjusted, for example, by contents of the ingredients (A), (C) to (E) and other ingredients.

In 100% by weight of the curable composition for inkjet, the content of the compound (B1) is preferably 5% by weight or more, more preferably 10% by weight or more, further preferably 20% by weight or more, preferably 95% by weight or less, more preferably 90% by weight or less, further preferably 70% by weight or less, and particularly preferably 60% by weight or less. In 100% by weight of the curable composition for inkjet, the respective contents of the compound (B1-1) and the compound (B1-2) are preferably 5% by weight or more, more preferably 10% by weight or more, further preferably 20% by weight or more, preferably 95% by weight or less, more preferably 90% by weight or less, further preferably 70% by weight or less, particularly preferably 60% by weight or less, and most preferably 50% by weight or less. When the respective contents of the compound (B1), the compound (B1-1) and the compound (B1-2) are more than or equal to the aforementioned lower limit, moist heat resistance of the cured product is further improved. When the respective contents of the compound (B1), the compound (B1-1) and the compound (B1-2) are less than or equal to the aforementioned upper limit, it is possible to effectively make the curable composition cure by light irradiation and heat addition.

[Photopolymerization Initiator (C)]

For curing of the curable composition by light irradiation, the curable composition for inkjet according to the present invention preferably contains a photopolymerization initiator (C). As the photopolymerization initiator (C), a photoradical polymerization initiator, a photocationic polymerization initiator and the like are recited. The photopolymerization initiator (C) is preferably a photoradical polymerization initiator. The photopolymerization initiator (C) may be used singly or in combination of two or more kinds.

The photoradical polymerization initiator is not particularly limited. The photoradical polymerization initiator is a compound that generates radical by light irradiation to initiate a radical polymerization reaction. Concrete examples of the photoradical polymerization initiator include benzoin, benzoin alkyl ethers, acetophenones, aminoacetophenones, anthraquinones, thioxanthones, ketals, 2,4,5-triarylimidazole dimer, riboflavin tetrabutylate, thiol compounds, 2,4,6-tris-s-triazine, organic halogen compounds, benzophenones, xanthones and 2,4,6-trimethylbenzoyldiphenylphosphine oxide. The photoradical polymerization initiator may be used singly or in combination of two or more kinds.

Examples of the benzoin alkyl ethers include benzoin methyl ether, benzoin ethyl ether and benzoin isopropyl ether. Examples of the acetophenones include acetophenone, 2,2-dimethoxy-2-phenylacetophenone, 2,2-diethoxy-2-phenylacetophenone and 1,1-dichloroacetophenone. Examples of the aminoacetophenones include 2-methyl-1-[4-(methylthio) phenyl]-2-morpholinopropane-1-one, 2-benzyl-2-dimethylamino-1-(4-morpholinophenyl)-butane-1-on e and N,N-dimethylaminoacetophenone. Examples of the anthraquinones include 2-methylanthraquinone, 2-ethylanthraquinone, 2-t-butylanthraquinone and 1-chloroanthraquinone. Examples of the thioxanthones include 2,4-dimethylthioxanthone, 2,4-diethylthioxanthone, 2-chlorothioxanthone and 2,4-diisopropylthioxanthone. Examples of the ketals include acetophenonedimethyl ketal and benzyldimethyl ketal. Examples of the thiol compounds include 2-mercaptobenzoimidazole, 2-mercaptobenzooxazole and 2-mercaptobenzothiazole. Examples of the organic halogen compounds include 2,2,2-tribromoethanol and tribromomethylphenylsulfone. Examples of the benzophenones include benzophenone and 4,4'-bisdiethylaminobenzophenone.

The photoradical polymerization initiator is preferably an α-aminoalkylphenone type photoradical polymerization initiator, and more preferably an α-aminoalkylphenone type photoradical polymerization initiator having a dimethylamino group. By using this specific photoradical polymerization initiator, it becomes possible to efficiently make the curable composition for inkjet photo-cure with a small amount of light exposure. Therefore, it is possible to effectively prevent the applied curable composition for inkjet from wet spreading by light irradiation, and to form a fine resist pattern with high accuracy. Further, when the photoradical polymerization initiator is an α-aminoalkylphenone type photopolymerization initiator having a dimethylamino group, it is possible to increase the heat-curing speed, and to improve the heat curability of the light irradiated product of the composition.

The inventors of the present invention found that by using an α-aminoalkylphenone type photoradical polymerization initiator having a dimethylamino group, not only the light curability can be improved, but also the heat curability can be improved. The α-aminoalkylphenone type photoradical polymerization initiator having a dimethylamino group is an ingredient that largely contributes to improvement in heat curability. Further, by using an α-aminoalkylphenone type photoradical polymerization initiator having a dimethylamino group, it is possible to improve the heat resistance and insulation reliability of the cured product. Excellent insulation reliability will keep the insulation resistance sufficiently high even when an electronic component such as a printed wiring board having a resist pattern formed of the curable composition for inkjet according to the present invention is used under a highly humid condition for a long term.

Concrete examples of the α-aminoalkylphenone type photoradical polymerization initiator include IRGACURE 907, IRGACURE 369, IRGACURE 379 and IRGACURE 379EG available from BASF. Other α-aminoalkylphenone type photopolymerization initiators than these may be used. Among these, 2-benzyl-2-dimethylamino-1-(4-morpholinophenyl)-butanone-1 (IRGACURE 369) or 2-(dimethylamino)-2-[(4-methylphenyl)methyl]-1-[4-(4-morpholinyl)phenyl]-1-butanone (IRGACURE 379 or IRGACURE 379EG) is preferred from the view point of further improving the light curability of the curable composition for inkjet and insulation reliability by the cured product. These are α-aminoalkylphenone type photoradical polymerization initiators having a dimethylamino group.

Together with the photoradical polymerization initiator, a photopolymerization initiation auxiliary agent may be used. Examples of the photopolymerization initiation auxiliary agent include N,N-dimethylaminobenzoic acid ethyl ester, N,N-dimethylaminobenzoic acid isoamyl ester, pentyl-4-dimethylaminobenzoate, triethylamine and triethanolamine. Other photopolymerization initiation auxiliary agents than these may be used. The photopolymerization initiation auxiliary agent may be used singly or in combination of two or more kinds.

Also, titanocene compounds such as CGI-784 (available from Ciba Specialty Chemicals) having absorption in the visible light region may be used for promoting photo reaction.

The photocationic polymerization initiator is not particularly limited, and examples include sulfonium salts, iodonium salts, metallocene compounds and benzoin tosylate. The photocationic polymerization initiator may be used singly or in combination of two or more kinds.

With respect to a total of 100 parts by weight of the compound (A) and the photoreactive compound (B), the content of the photopolymerization initiator (C) is preferably 0.1 parts by weight or more, more preferably 1 part by weight or more, further preferably 3 parts by weight or more, preferably 30 parts by weight or less, more preferably 15 parts by weight or less, and further preferably 10 parts by weight or less. When the content of the photopolymerization initiator (C) is more than or equal to the aforementioned lower limit and less than or equal to the aforementioned upper limit, the curable composition cures more effectively by light irradiation.

[Compound Having Cyclic Ether Group (D)]

The curable composition for inkjet according to the present invention contains a compound having a cyclic ether group (D) so that it will cure more efficiently by heat addition. By the use of the compound (D), after obtaining a primary cured product by making the curable composition for inkjet primarily cure by light irradiation, the primary cured product can be made to cure more efficiently by heat addition. Therefore, by the use of the compound (D), it is possible to form a resist pattern efficiently and accurately, and to further improve the heat resistance and the insulation reliability of the cured product. The compound having a cyclic ether group (D) may be used singly or in combination of two or more kinds.

The compound having a cyclic ether group (D) is a compound that is different from both the compound (A) and the photoreactive compound (B), and is not particularly limited as far as it has a cyclic ether group. As the cyclic ether group in the compound (D), an epoxy group, an oxetanyl group and the like are recited. Among these, from the viewpoint of improving the curability and obtaining a cured product having more excellent heat resistance, the cyclic ether group is preferably an epoxy group. The compound having a cyclic ether group (D) preferably has two or more cyclic ether groups. Preferably, the compound having a cyclic ether group (D) does not have a (meth)acryloyl group. The compound not having a (meth)acryloyl group but having a cyclic ether group (D) is different from compound (A).

Concrete examples of the compound having an epoxy group include bisphenol S type epoxy compound, diglycidyl phthalate compound, heterocyclic epoxy compound such as triglycidyl isocyanurate, bixylenol type epoxy compound, biphenol type epoxy compound, tetraglycidylxylenoylethane compound, bisphenol A type epoxy compound, hydrogenated bisphenol A type epoxy compound, bisphenol F type epoxy compound, bisphenol AD type epoxy compound, brominated bisphenol A type epoxy compound, phenol novolak type epoxy compound, cresol novolak type epoxy compound, alicyclic epoxy compound, novolak type epoxy compound of bisphenol A, chelate type epoxy compound, glyoxal type epoxy compound, amino group-containing epoxy compound, rubber-modified epoxy compound, dicyclopentadienephenolic type epoxy compound, silicone-modified epoxy compound and ε-caprolactone-modified epoxy compound.

The compound having a cyclic ether group (D) preferably has an aromatic backbone. By the use of the compound having an aromatic backbone and a cyclic ether group, heat stability of the curable composition during storage and discharge is further improved, and the curable composition is less likely to gelate during storage. Further, since the compound having an aromatic backbone and a cyclic ether group has better compatibility with the compound having a (meth) acryloyl group and a cyclic ether group (A), the photoreactive compound (B) and the potential curing agent (E), in comparison with the compound not having an aromatic backbone and having a cyclic ether group, the insulation reliability is further improved.

The compound having an oxetanyl group is exemplified, for example, in Japanese Patent No. 3074086.

The compound having a cyclic ether group (D) is preferably liquid at 25° C. The viscosity at 25° C. of the compound having a cyclic ether group (D) preferably exceeds 300 mPa·s. The viscosity at 25° C. of the compound having a cyclic ether group (D) is preferably 80 Pa·s or less. When the viscosity of the compound having a cyclic ether group (D) is more than or equal to the aforementioned lower limit, resolution at the time of forming a cured product layer is further improved. When the viscosity of the compound having a cyclic ether group (D) is less than or equal to the aforementioned upper limit, dischargeability of the curable composition is further improved, and compatibility of the compound having a cyclic ether group (D) with other ingredients is further increased, so that insulation reliability is further improved.

The blending amount of the compound having a cyclic ether group (D) is appropriately adjusted so that appropriate curing is achieved by heat addition, and is not particularly limited. In 100% by weight of the curable composition for inkjet, the content of the compound having a cyclic ether group (D) is preferably 2% by weight or more and preferably 60% by weight or less. In 100% by weight of the curable composition for inkjet, the content of the compound having a cyclic ether group (D) is more preferably 3% by weight or more, further preferably 5% by weight or more, and more preferably 50% by weight or less. When the content of the compound (D) is more than or equal to the aforementioned lower limit, it is possible to make the curable composition cure more effectively by heat addition. When the content of the compound (D) is less than or equal to the aforementioned upper limit, it is possible to further improve the heat resistance of the cured product, and to further prevent the curable composition for inkjet applied by an inkjet method from wet spreading.

From the view point of further improving the heat resistance of the cured product and the uniformity of the cured product film, in 100% by weight of the curable composition for inkjet, the total content of the compound having a (meth) acryloyl group and a cyclic ether group (A) and the compound having a cyclic ether group (D) is preferably 8% by weight or more, more preferably 15% by weight or more, further preferably 40% by weight or more, preferably 80% by weight or less, more preferably 63% by weight or less, further preferably 60% by weight or less, and particularly preferably 50% by weight or less. In particular, in 100% by weight of the curable composition for inkjet, the total content of the compound (A) and the compound (D) is preferably 15% by weight or more and preferably 50% by weight or less. When the total content of the compound (A) and the compound (D) is 15% by weight or more, the heat resistance of the cured product can be further improved. When the total content of the compound (A) and the compound (D) is 50% by weight or less, the uniformity of the cured product film can be further improved.

[Potential Curing Agent (E)]

The potential curing agent (E) is not particularly limited. As the potential curing agent (F), a conventionally known potential curing agent may be used. The potential curing agent (E) may be used singly or in combination of two or more kinds.

As the potential curing agent (E), dicyandiamide, hydrazide compounds and the like are recited.

From the view point of further reducing the change in viscosity of the curable composition at the time of being warmed, and further extending the pot life, the potential curing agent (E) is preferably dicyandiamide.

Concrete examples of the potential curing agent (E) include potential curing agents in which triphenylphosphine (heat curing agent) is covered with a shell formed of methyl (meth)acrylate resin, styrene resin or the like (for example, "EPCAT-P" and "EPCAT-PS" available from NIPPON KAYAKU Co., Ltd.), potential curing agents in which a heat curing agent such as amine is covered with a shell formed of polyurea polymer or radical polymer (described in Japanese Patent No. 3031897 and Japanese Patent No. 3199818), potential curing agents obtained by dispersing and enclosing a heat curing agent such as modified imidazole in epoxy resin, followed by grinding ("Novacure "HXA3792" and "HXA3932HP" available from Asahi Kasei E-materials Corp.), potential curing agents in which a curing agent is dispersed and contained in thermoplastic polymer (described in Japanese Patent No. 3098061), and imidazole potential curing agents covered with a tetrakis phenolic compound or the like (for example, "TEP-2E4MZ" and "HIPA-2E4MZ" available from NIPPON SODA CO., LTD.). Potential curing agents other than those recited above may be used.

The curing agent (E) is preferably a reaction viscous product (E1) obtained by reacting dicyandiamide with a functional group-containing compound having a functional group capable of reacting with the dicyandiamide. By using such a reaction viscous product (E1), it is possible to improve the insulation reliability by the cured product. Further, the curable composition is less likely to have change in viscosity when it is warmed to 50° C. or higher, and has an extended pot life.

The reaction viscous product (E1) may not be viscous in the curable composition for inkjet as far as the reaction viscous product (E1) by itself has a viscous property before being used in the curable composition for inkjet. Also, the reaction viscous product may be viscous when the reaction viscous product (E1) is removed from the curable composition for inkjet.

Since dicyandiamide (dicyandiamide particle) which is solid at normal temperature (23° C.) exists in a solid in a liquid ingredient, it can precipitate during storage or cause clogging of a nozzle of an inkjet head. For solving such a problem, it is preferred to preliminarily react dicyandiamide with a functional group-containing compound having a functional group capable of reacting with the dicyandiamide to produce the reaction viscous product (E1), and to add the reaction viscous product (E1) to the composition. That is, in the curable composition for inkjet according to the present invention, it is preferred to use the reaction viscous product (E1) obtained by reacting dicyandiamide with a functional group-containing compound having a functional group capable of reacting with the dicyandiamide, as the curing agent (E). When the reaction viscous product (E1) is used, the pot life of the composition and the insulation reliability by the cured product are improved.

Preferably, in the reaction viscous product (E1) before blended into the curable composition for inkjet, an organic solvent is not blended or is blended in an amount of 100 parts by weight or less with respect to 100 parts by weight of the reaction viscous product (E1). When an organic solvent is blended in the reaction viscous product (E1), the amount of the organic solvent blended with respect to 100 parts by weight of the reaction viscous product (E1) is preferably 50 parts by weight or less, more preferably 20 parts by weight or less, further preferably 10 parts by weight or less, and particularly preferably 1 part by weight or less.

The reaction viscous product (E1) is preferably a reaction product obtained by reacting the functional group-containing compound with part of active hydrogen in dicyandiamide. The functional group capable of reacting with dicyandiamide in the functional group-containing compound generally reacts with part of active hydrogen in dicyandiamide.

The dicyandiamide reacted with the functional group-containing compound is preferably powdered state. By reacting powdery dicyandiamide with the functional group-containing compound, the product is no longer powdered state, and the viscous reaction viscous product (E1) is obtained.

From the view point of easily synthesizing the reaction viscous product (E1) and obtaining a curable composition having a longer pot life, the functional group-containing compound that reacts with the dicyandiamide preferably has at least one functional group selected from the group consisting of a hydroxyl group, a cyclic ether group, a carboxyl group and an isocyanate group.

From the view point of easily synthesizing the reaction viscous product (E1) and obtaining a curable composition having a longer pot life, the functional group-containing compound that reacts with the dicyandiamide is preferably a compound having a cyclic ether group. The compound having a cyclic ether group that reacts with dicyandiamide is preferably a compound having one cyclic ether group.

From the view point of easily synthesizing the reaction viscous product (E1) and obtaining a curable composition having a longer pot life, the functional group-containing compound that reacts with the dicyandiamide is preferably a compound having an epoxy group. The compound having an epoxy group that reacts with dicyandiamide is preferably a compound having one epoxy group.

From the view point of easily synthesizing the reaction viscous product (E1) and obtaining a curable composition for inkjet having a longer pot life, and further from the viewpoint of further improving the heat resistance of the cured product of the curable composition, the functional group-containing compound that reacts with the dicyandiamide preferably has an aromatic backbone, and is preferably a compound having an aromatic backbone and a cyclic ether group, and is particularly preferably a compound having an aromatic backbone and an epoxy group.

Concrete examples of the functional group-containing compound include glycidyl ethers such as phenylglycidyl ether, butylglycidyl ether, ortho-cresylglycidyl ether, meta-cresylglycidyl ether, para-cresylglycidyl ether, allyl glycidyl ether, and para-t-butylphenylglycidyl ether, glycidyl(meth)acrylate, and 3,4-epoxycyclohexylmethyl(meth)acrylate.

From the view point of further improving the heat resistance of the cured product, the functional group-containing compound is preferably phenylglycidyl ether, ortho-cresylglycidyl ether, meta-cresylglycidyl ether, para-cresylglycidyl ether or para-t-butylphenylglycidyl ether having an aromatic ring, respectively.

In the reaction between the dicyandiamide and the functional group-containing compound, it is desired that preferably 0.2 mol or more, more preferably 1 mol or more, preferably 4 mol or less, and more preferably 3 mol or less of the functional group-containing compound is reacted with 1 mol of the dicyandiamide. In other words, the reaction viscous product (E1) is desirably a reaction viscous product obtained by reacting preferably 0.2 mol or more, more preferably 1 mol or more, preferably 4 mol or less, and more preferably 3 mol or less of the functional group-containing compound is reacted with 1 mol of the dicyandiamide. From the view point of obtaining a curable composition having more excellent pot life, it is particularly desired that the reaction viscous product (E1) is a reaction viscous product obtained by reacting 1 mol or more and 3 mol or less of the functional group-containing compound with 1 mol of the dicyandiamide. When the use amount of the functional group-containing compound is less than the aforementioned lower limit, unreacted dicyandiamide may precipitate. When the use amount of the functional group-containing compound exceeds the aforementioned upper limit, any active hydrogen in the reaction viscous product is inactivated, and the compound (D) may be no longer made to cure. In the present reaction, it is preferred to allow reaction in the presence of a solvent or a reaction accelerator as is necessary at 60° C. to 140° C.

In the reaction between the dicyandiamide and the functional group-containing compound, a solvent for dissolving dicyandiamide may be used. The solvent has only to dissolve dicyandiamide. Examples of usable solvents include acetone, methylethyl ketone, dimethylformamide and methyl cellosolve.

For promoting the reaction between the dicyandiamide and the functional group-containing compound, a reaction accelerator may be used. As the reaction accelerator, reaction accelerators that are known and commonly used in the art such as phenols, amines, imidazoles and triphenylphosphine may be used.

From the view point of preventing the pot life from deteriorating, and controlling curing unevenness, in the curable composition for inkjet according to the present invention, the reaction viscous product (E1) is preferably compatible with the compound having a cyclic ether group (D), with the compound having a (meth)acryloyl group and a cyclic ether group (A), and with the photoreactive compound (B), and is preferably dissolved in the curable composition.

The reaction viscous product (E1) is preferably compatible with the compound having a cyclic ether group (D), preferably compatible with the compound having a (meth)acryloyl group and a cyclic ether group (A), and preferably compatible with the photoreactive compound (B).

The reaction viscous product (E1) is a non-powdery reaction viscous product, obtained, for example, by reaction between powdery dicyandiamide and the functional group-containing compound. From the view point of further improving the inkjet dischargeability, the reaction viscous product (E1) is not preferably solid, not preferably crystal and not preferably crystalline solid. The reaction viscous product (E1) is preferably liquid or semi-solid.

The reaction viscous product (E1) is preferably transparent or translucent. Whether or not the reaction viscous product (E1) is transparent or translucent can be determined by whether or not an object is visible when the object is seen through the reaction viscous product (E1) having a thickness of 5 mm.

The blending ratio between the compound having a cyclic ether group (D) and the potential curing agent (E) is not particularly limited. The content of the potential curing agent (E) with respect to 100 parts by weight of the compound having a cyclic ether group (D) is preferably 5 parts by weight or more, more preferably 10 parts by weight or more, preferably 70 parts by weight or less, and more preferably 50 parts by weight or less.

[Other Ingredient]

The curable composition for inkjet according to the present invention may contain a heat curing agent other than the potential curing agent (E) together with the potential curing agent (E). Further, the curable composition for inkjet according to the present invention may contain a curing accelerator.

Concrete examples of the heat curing agent include organic acids, amine compounds, amide compounds, hydrazide compounds, imidazole compounds, imidazoline compounds, phenol compounds, urea compounds, polysulfide compounds and acid anhydrides. As the heat curing agent, modified polyamine compounds such as amine-epoxy adduct may be used.

Examples of the curing accelerator include tertiary amines, imidazole, quaternary ammonium salts, quaternary phosphonium salts, organic metal salts, phosphorus compounds and urea compounds.

The curable composition for inkjet according to the present invention may contain a solvent as is necessary, for example, for the purpose of adjusting the viscosity. The solvent is preferably a solvent that does not react with ingredients in the curable composition. A volatile solvent is preferred because it can be dried off by heating in an oven or on a hot plate, or by pressure reduction in a chamber under reduced pressure before conducting curing reaction of the curable composition. Also, the curable composition for inkjet according to the present invention may contain just a small amount of organic solvent.

The curable composition for inkjet according to the present invention may contain various additives as far as the object of the present invention is not interfered. The additives are not particularly limited, and examples include a coloring agent, a polymerization inhibitor, a defoaming agent, a leveling agent and an adhesion imparting agent.

Examples of the coloring agent include phthalocyanine blue, phthalocyanine green, iodine green, disazo yellow, crystal violet, titanium oxide, carbon black and naphthalene black. Examples of the polymerization inhibitor include hydroquinone, hydroquinone monomethyl ether, tert-butyl catechol, pyrogallol and phenothiazine. Examples of the defoaming agent include silicone defoaming agents, fluorine defoaming agents and polymer defoaming agents. Examples of the leveling agent include silicone leveling agents, fluorine leveling agents and polymer leveling agents. Examples of the adhesion imparting agent include imidazole adhesion imparting agents, thiazole adhesion imparting agents, triazole adhesion imparting agents and silane coupling agents.

In the curable composition for inkjet according to the present invention, the viscosity at 25° C. measured in conformance with JIS K2283 is 160 mPa·s or more and 1200 mPa·s or less. When the viscosity of the curable composition for inkjet is more than or equal to the aforementioned lower limit and less than or equal to the aforementioned upper limit, the curable composition for inkjet can be discharged from an inkjet head easily and accurately. Further, even when the curable composition for inkjet is warmed to 50° C. or higher, the composition can be discharged from an inkjet head easily and accurately.

The viscosity is preferably 1000 mPa·s or less, and more preferably less than 500 mPa·s. When the viscosity satisfies the aforementioned preferred upper limit, the more excellent dischargeability is achieved when the curable composition is continuously discharged from a head. Also, from the view point of further preventing wet spreading of the curable composition and further improving the resolution in forming a cured product layer, the viscosity is preferably 500 mPa·s or more.

Preferably, the curable composition for inkjet according to the present invention does not contain an organic solvent, or contains an organic solvent in an amount of 50% by weight or less in 100% by weight of the curable composition. In 100% by weight of the curable composition, the content of the organic solvent is more preferably 20% by weight or less, further preferably 10% by weight or less, and particularly preferably 1% by weight or less. The lower the content of the organic solvent, the more the resolution at the time of forming a cured product layer is improved.

Preferably, the curable composition for inkjet according to the present invention does not contain an organic solvent, or contains an organic solvent in an amount of 50 parts by weight or less in 100 parts by weight of the reaction viscous product (E1). The content of the organic solvent with respect to 100 parts by weight of the reaction viscous product (E1) is more preferably 20 parts by weight or less, further preferably 10 parts by weight or less, and particularly preferably 1 part by weight or less. The lower the content of the organic solvent, the more the resolution at the time of forming a cured product layer is improved.

(Method for Producing Electronic Component)

Next, a method for producing an electronic component according to the present invention will be described.

A method for producing an electronic component according to the present invention is featured in that the curable composition for inkjet as described above is used. In other words, in the method for producing an electronic component according to the present invention, first, the curable composition for inkjet is applied by an inkjet method to draw a pattern. At this time, it is particularly preferred to directly draw with the curable composition for inkjet. The expression "directly draw" means drawing without using a mask. As the electronic component, a printed wiring board, a touch panel component and the like are recited. The electronic component is preferably a wiring board, and is more preferably a printed wiring board.

For application of the curable composition for inkjet, an inkjet printer is used. The inkjet printer has an inkjet head. The inkjet head has a nozzle. The inkjet device preferably has a warming part for warming so that the temperature in the inkjet device or in the inkjet head is 50° C. or higher. The curable composition for inkjet is preferably applied on an application object member. As the application object member, a substrate and the like are recited. As the substrate, a substrate having a wiring or the like formed on its top face and the like are recited. The curable composition for inkjet is preferably applied on a printed substrate.

Also, by the method for producing an electronic component according to the present invention, a glass substrate for a display device such as liquid crystal display device may be fabricated by replacing the substrate with a member based on glass. Concretely, on the glass, a conductive pattern of ITO or the like is provided by a method like vapor deposition, and on the conductive pattern, a cured product layer may be formed by an inkjet method by the method for producing an electronic component according to the present invention. By providing a pattern on the cured product layer with a conductive ink or the like, the cured product layer becomes an insulation film, and electric connection is obtained between predetermined patterns in the conductive pattern on the glass.

Then the curable composition for inkjet drawn into a pattern is made to cure by light irradiation and heat addition to form a cured product layer. In this manner, it is possible to obtain an electronic component having a cured product layer. The cured product layer may be an insulation film or may be a resist pattern. The insulation film may be a patterned insulation film. The cured product layer is preferably a resist pattern. The resist pattern is preferably a solder resist pattern.

The method for producing an electronic component according to the present invention is preferably a method for producing a printed wiring board having a resist pattern. Preferably, the curable composition for inkjet is applied by an inkjet method and drawn into a pattern, and the curable composition for inkjet drawn into a pattern is made to cure by light irradiation and heat addition to form a resist pattern.

The curable composition for inkjet drawn into a pattern may be made to primarily cure by light addition to obtain a primary cured product. As a result, it is possible to prevent the drawn curable composition for inkjet from wet spreading, and to form a resist pattern with high accuracy. When a primary cured product is obtained by light irradiation, the primary cured product may be made to cure by heat addition to obtain a cured product, and thus a resist pattern may be formed. The curable composition for inkjet according to the present invention is curable by light irradiation and heat addition. When both light curing and heat curing are used, it is possible to form a resist pattern having more excellent heat resistance. Heating temperature at the time of curing by heat addition is preferably 100° C. or more, more preferably 120° C. or more, preferably 250° C. or less, and more preferably 200° C. or less.

The light irradiation may be conducted after drawing, or may be conducted concurrently with drawing. For example, light irradiation may be conducted concurrently with discharge or directly after discharge of the curable composition. For conducting light irradiation concurrently with drawing as described above, a light source may be arranged so that a light irradiation part is situated at the drawing position by the inkjet head.

The light source for light irradiation is appropriately selected depending on the light for irradiation. Examples of the light source include a UV-LED, a low-pressure mercury lamp, a medium-pressure mercury lamp, a high-pressure mercury lamp, a ultrahigh-pressure mercury lamp, a xenon lamp and a metal halide lamp. The light for irradiation is generally ultraviolet ray, and may be an electron ray, α ray, β ray, γ ray, X ray, neutron ray and the like.

The temperature at the time of application of the curable composition for inkjet is not particularly limited as far as it renders the curable composition for inkjet viscous enough to be discharged from an inkjet head. The temperature at the time of application of the curable composition for inkjet is preferably 50° C. or more, more preferably 60° C. or more, and preferably 100° C. or less. The viscosity of the curable composition for inkjet at the time of application is not particularly limited as far as the curable composition for inkjet can be discharged from an inkjet head.

Also there is a method of cooling the substrate at the time of printing. By cooling the substrate, the viscosity of the curable composition increases at the time of reaching the substrate and the resolution improves. In this case, it is preferred to limit the cooling to such a degree that condensation will not occur, or to dehumidify the atmospheric air so that condensation will not occur. Also, since the substrate contracts when it is cooled, the dimension accuracy may be corrected.

Since the curable composition for inkjet according to the present invention contains the potential curing agent (E), even when the curable composition for inkjet is heated in an inkjet head, for example, the curable composition for inkjet has a sufficiently long pot life and can be discharged stably. Further, since the curable composition for inkjet can be heated until its viscosity becomes suited for application by an inkjet method, it is possible to preferably produce an electronic component such as printed wiring board by using the curable composition for inkjet according to the present invention.

In the following, the present invention will be concretely described by way of examples and comparative examples. The present invention is not limited only to the following examples.

SYNTHESIS EXAMPLE 1

In a three-necked flask equipped with a stirrer, a thermometer and a dropping funnel, 50 g of methyl cellosolve, 15 g of dicyandiamide and 1 g of 2,4-diamino-6-[2'-undecylimidazolyl-(1')]-ethyl-s-triazine were added, and heated to 100° C. to dissolve dicyandiamide. After dissolution, 130 g of butyl glycidyl ether was dropped over 20 minutes from the dropping funnel, and allowed to react for one hour. Then the temperature was decreased to 60° C., and the solvent was removed under reduced pressure, to obtain a yellow and translucent reaction viscous product. The obtained reaction viscous product did not contain a solvent.

SYNTHESIS EXAMPLE 2

In a three-necked flask equipped with a stirrer, a thermometer and a dropping funnel, 50 g of methyl cellosolve, 15 g of dicyandiamide and 1 g of 2,4-diamino-6-[2'-undecylimidazolyl-(1')]-ethyl-s-triazine were added, and heated to 100° C. to dissolve dicyandiamide. After dissolution, 40 g of ortho-cresyl glycidyl ether was dropped over 20 minutes from the dropping funnel, and allowed to react for one hour. Then the temperature was decreased to 60° C., and the solvent was removed under reduced pressure, to obtain a yellow and translucent reaction viscous product. The obtained reaction viscous product did not contain a solvent.

SYNTHESIS EXAMPLE 3

A yellow and translucent reaction viscous product was obtained in a similar manner to Synthesis Example 2 except that the dropping amount of ortho-cresyl glycidyl ether was changed from 40 g to 95 g. The obtained reaction viscous product did not contain a solvent.

In Examples and Comparative Examples, materials shown in the following Table 1 were appropriately used.

TABLE 1

| | |
|---|---|
| Compound (A) having (one or two) (meth)acryloyl groups and cyclic ether group | Glycidyl methacrylate<br>Glycidyl acrylate<br>3,4-epoxycyclohexylmethyl acrylate<br>4-hydroxybutyl acrylate glycidyl ether<br>UVACURE 1561 (available from DAICEL-CYTEC Company, Ltd.)<br>Epoxy acrylate of bisphenol A type epoxy compound (half ester) |

TABLE 1-continued

| | |
|---|---|
| Photoreactive compound (B) | EBECRYL 3700 (available from DAICEL-CYTEC Company, Ltd.) |
| | Epoxy acrylate of bisphenol A type epoxy compound |
| | Triethylene glycol diacrylate |
| | Isobornyl acrylate |
| | IRR214-K (available from DAICEL-CYTEC Company, Ltd.) |
| | Tricyclodecane dimethanol diacrylate |
| Photopolymerization initiator (C) | Irgacure 907 (available from BASF Japan Ltd.) |
| | a-aminoalkylphenone type photoradical polymerization initiator not having a dimethylamino group |
| | Irgacure 369 (available from BASF Japan Ltd.) |
| | a-aminoalkylphenone type photoradical polymerization initiator having a dimethylamino group |
| | Irgacure 379EG (available from BASF Japan Ltd.) |
| | a-aminoalkylphenone type photoradical polymerization initiator having a dimethylamino group |
| | TPO (available from BASF Japan Ltd.) |
| | Acylphosphine oxide type photoradical polymerization initiator |
| | Irgacure 184 (available from BASF Japan Ltd.) |
| | a-hydroxyalkylphenone type photoradical polymerization initiator |
| Compound (D) having cyclic ether group | jER828 (available from Mitsubishi Chemical Corporation) |
| | Bisphenol A type epoxy compound |
| | jER806 (available from Mitsubishi Chemical Corporation) |
| | Bisphenol F type epoxy compound |
| Potential curing agent (E) | DICY7 (available from Mitsubishi Chemical Corporation) |
| | Dicyandiamide |
| | Reaction viscous product obtained in Synthesis Example 1 |
| | Reaction viscous product obtained in Synthesis Example 2 |
| | Reaction viscous product obtained in Synthesis Example 3 |
| | SDH (available from Otsuka Chemical Co., Ltd.) |
| | Sebacic dihydrazide |

EXAMPLE 1

10 parts by weight of glycidyl methacrylate corresponding to the compound having a (meth)acryloyl group and a cyclic ether group (A), 20 parts by weight of epoxy acrylate of bisphenol A type epoxy compound ("EBECRYL 3700" available from DAICEL-CYTEC Company, Ltd.) corresponding to the compound having a (meth)acryloyl group and a cyclic ether group (A), 30 parts by weight of triethyleneglycol diacrylate corresponding to the photoreactive compound (B), 20 parts by weight of isobornyl acrylate corresponding to the photoreactive compound (B), 4 parts by weight of Irgacure 907 (α-aminoacetophenone type photoradical polymerization initiator, available from BASF Japan Ltd.) corresponding to the photopolymerization initiator (C), 15 parts by weight of bisphenol A type epoxy compound ("jER828" available from Mitsubishi Chemical Corporation) corresponding to the compound having a cyclic ether group (D), and 1 part by weight of dicyandiamide ("DICY7" available from Mitsubishi Chemical Corporation) corresponding to the potential curing agent (E) were mixed, to obtain a curable composition for inkjet.

EXAMPLES 2 to 43 AND COMPARATIVE EXAMPLES 1 And 2

Curable compositions for inkjet were obtained in a similar manner to Example 1 except that the kinds and blending amounts of ingredients were changed as shown in the following Tables 2 to 4.

In the curable compositions for inkjet obtained in Examples 27 to 43, the reaction viscous product was compatible with the compound having a (meth)acryloyl group and a cyclic ether group, compatible with the photoreactive compound, and compatible with the compound having a cyclic ether group, and was dissolved in the curable composition.

(Evaluation)
(1) Viscosity

In conformance with JIS K2283, the viscosity at 25° C. of the obtained curable composition for inkjet was measured by using a viscometer ("TVE22L" available from TOKI SANGYO CO., LTD).

(2) Dischargeability

A curable composition for inkjet was discharged on a substrate from an inkjet head of a piezo type inkjet printer equipped with a UV illuminator. Whether the curable composition is dischargeable at the time of drawing by the inkjet printer was evaluated by visual check, and dischargeability was judged according to the following criteria. At the time of conducting the discharge test for a curable composition having a viscosity of 500 mPa·s or less, the head temperature was set at 80° C., and at the time of conducting the discharge test for a curable composition having a viscosity exceeding 500 mPa·s, the head temperature was set at 95° C.

[Judging Criteria of Inkjet Dischargeability]

∘∘: The curable composition could be discharged from the head continuously for over 10 hours.

∘: The curable composition could be discharged from the head continuously for over 10 hours, but slight discharging unevenness occurred during continuous discharging for 10 hours.

Δ: The curable composition could be continuously discharged from the head, but could not be continuously discharged for over 10 hours.

x: The curable composition could not be discharged from the head in early stage of the discharging.

(3) Wet Spreading

A glass epoxy substrate (100 mm×100 mm) having copper wiring provided on the top face was prepared. On this substrate, a curable composition for inkjet discharged from an inkjet head of a piezo type inkjet printer equipped with a UV illuminator was applied, and drawn into a pattern. At the time of conducting the discharge test for a curable composition for inkjet having a viscosity of 500 mPa·s or less, the head temperature was set at 80° C., and at the time of conducting the discharge test for a curable composition for inkjet having a viscosity exceeding 500 mPa·s, the head temperature was set at 95° C.

The curable composition for inkjet (thickness 20 μm) applied on the substrate was irradiated with an ultraviolet ray having a wavelength of 365 nm so that the irradiation energy was 1000 mJ/cm$^2$.

After 5 minutes from irradiation with the ultraviolet ray, wet spreading of the pattern was visually observed, and wet spreading was judged according to the following judging criteria.

[Judging Criteria of Wet Spreading]

∘∘: The wet spreading condition is not more than 40 μm plus the target line width.

∘: The wet spreading condition is more than 40 μm and 75 μm or less plus the target line width.

x: The composition layer wet spreads from the drawn part, and gaps between lines are lost, or the wet spreading condition is more than 75 μm plus the target line width.

(4) Unevenness in Cured Product Film

A glass epoxy substrate (100 mm×100 mm) having copper wiring provided on the top face was prepared. This substrate was warmed to 80° C., and the curable composition for inkjet discharged from an inkjet head of a piezo type inkjet printer (head temperature: 80° C.) equipped with a UV illuminator was applied on the entire surface of the substrate.

The curable composition for inkjet applied on the substrate (thickness 20 μm) was made to really cure by irradiation with an ultraviolet ray having a wavelength of 365 nm so that the irradiation energy was 100 mJ/cm$^2$, and heating at 180° C. for 1 hour, and thus a resist pattern (cured product film) which is a cured product was formed.

The surface of the obtained cured product film was observed by visual check, and whether there is unevenness in the cured product film was evaluated. Unevenness in the cured product film was judged according to the following judging criteria.

[Judging Criteria of Unevenness in Cured Product Film]

∘∘: Unevenness is not observed in the surface of the cured product film by visual check.

∘: Unevenness is partly observed in the surface of the cured product film by visual check.

x: Unevenness is entirely observed in the surface of the cured product film by visual check.

(5) Heat Resistance

A glass epoxy substrate (100 mm×100 mm) having copper wiring provided on the top face was prepared. This substrate was warmed to 80° C., and the curable composition for inkjet discharged from an inkjet head of a piezo type inkjet printer (head temperature: 80° C.) equipped with a UV illuminator was applied on the entire surface of the substrate.

The curable composition for inkjet applied on the substrate (thickness 20 μm) was made to really cure by irradiation with an ultraviolet ray having a wavelength of 365 nm so that the irradiation energy was 1000 mJ/cm$^2$, and heating at 180° C. for 1 hour, and thus a resist pattern which is a cured product was formed and a test piece was obtained.

The obtained test piece was left still at 270° C. for 5 minutes. Then, adhesiveness of the cured product to the substrate was examined by a crosscut tape test (JIS 5400 6.15), and heat resistance was judged according to the following judging criteria. In the cured product, cuts were made at intervals of 1 mm by means of a cutter to form a grid of 100 cells, and cellophane tape (JIS Z1522) was put onto the cured product having cuts, and one end of the tape was strongly peeled off at an angle of 45 degrees, and the peeling condition was checked.

[Judging Criteria of Heat Resistance]

∘∘: The cured product not peels off.

∘: The cured product partly peels off.

x: The cured product entirely peels off.

(6) Storage Stability (Length of Pot Life)

Using a membrane filter of 5 μm, the obtained curable composition for inkjet was filtered, and the filtered curable composition for inkjet was heated at 80° C. for 12 hours.

A FR-4 substrate with a copper foil having a copper foil pasted on the top face was prepared. It was attempted to apply, on the copper film of the substrate, a curable composition for inkjet discharged from an inkjet head of a piezo type inkjet printer equipped with a UV illuminator and draw a pattern with lines of 80 μm wide at line intervals of 80 μm. From the dischargeability from the inkjet head at this time, storage stability was judged according to the following judging criteria. At the time of conducting the discharge test for a curable composition having a viscosity of 500 mPa·s or less, the head temperature was set at 80° C., and at the time of conducting the discharge test for a curable composition having a viscosity of more than 500 mPa·s, the head temperature was set at 95° C.

[Judging Criteria of Storage Stability]

∘: The composition could be discharged from the inkjet head.

Δ: The composition could not be discharged from the inkjet heat because curing of the composition proceeded or the viscosity of the composition increased before discharging.

x: The composition significantly cured.

(7) Insulation Reliability (Migration Resistance)

A comb-shaped test pattern B of IPC-B-25 was prepared. This comb-shaped test pattern B was warmed to 80° C., and a curable composition for inkjet discharged from an inkjet head of a piezo type inkjet printer equipped with a UV illuminator was applied so that the entire surface of the comb-shaped test pattern B was covered. At the time of conducting the discharge test for a curable composition having a viscosity of 500 mPa·s or less, the head temperature was set at 80° C., and at the time of conducting the discharge test for a curable composition having a viscosity of more than 500 mPa·s, the head temperature was set at 95° C.

The applied curable composition for inkjet (thickness 20 μm) was irradiated with an ultraviolet ray having a wavelength of 365 nm so that the irradiation energy was 1000 mJ/cm$^2$ by using a high-pressure mercury lamp. Then the primary cured product was made to cure by heating at 150° C. for 60 minutes, to form a resist pattern which is a cured product, and a test piece was obtained.

The obtained test piece was subjected to a 500-hour humidification test at 85° C., at a relative humidity of 85% under application of DC 50 V. Insulation resistance after humidification test was measured, and insulation reliability was judged according to the following criteria.

[Judging Criteria of Insulation Reliability]

∘: Insulation resistance is $3\times10^{10}\Omega$ or more

Δ: Insulation resistance is $1\times10^9$ or more and less than $3\times10^{10}$ x: Insulation resistance is less than $1\times10^9$ The results are shown in the following Tables 2 to 4. In the following Tables 2 to 4, "-" indicates that evaluation was not made.

TABLE 2

| | | | Ex. 1 | Ex. 2 | Ex. 3 | Ex. 4 | Ex. 5 | Ex. 6 | Ex. 7 | Ex. 8 |
|---|---|---|---|---|---|---|---|---|---|---|
| Blending ingredient (part by weight) | Compound (A) | Glycidyl methacrylate | 10 | | | | | | | |
| | | Glycidyl acrylate | | 10 | | | | | 10 | 10 | 10 |
| | | 3,4-epoxycyclohexylmethyl acrylate | | | 10 | | | | | |
| | | 4-hydroxybutyl acrylate glycidyl ether | | | | 10 | | | | |
| | | UVACURE 1561 | | | | | 10 | | | |
| | Compound (B) | EBECRYL 3700 | 20 | 20 | 20 | 20 | 20 | 20 | 20 | 20 |
| | | Triethylene glycol diacrylate | 30 | 30 | 30 | 30 | 30 | 30 | 30 | 30 |
| | | Isobornyl acrylate | 20 | 20 | 20 | 20 | 20 | 20 | 20 | 20 |
| | | IRR214-K | | | | | | | | |
| | Photopolymerization initiator (C) | Irgacure 907 | 4 | 4 | 4 | 4 | 4 | | 4 | 4 |
| | | Irgacure 369 | | | | | | 4 | | |
| | | Irgacure 379EG | | | | | | | | |
| | | TPO | | | | | | | | |
| | | Irgacure 184 | | | | | | | | |
| | Compound (D) | jER828 | 15 | 15 | 15 | 15 | 15 | 15 | | 15 |
| | | jER806 | | | | | | | 15 | |
| | Potential curing agent (E) | DICY7 | 1 | 1 | 1 | 1 | 1 | 1 | 1 | |
| | | Reaction viscous product obtained in Synthesis Example 1 | | | | | | | | |
| | | Reaction viscous product obtained in Synthesis Example 2 | | | | | | | | |
| | | Reaction viscous product obtained in Synthesis Example 3 | | | | | | | | |
| | | SDH | | | | | | | | 1 |
| Total content (% by weight) of compound (A) and compound (D) in 100% by weight of curable composition for inkjet | | | 25 | 25 | 25 | 25 | 25 | 25 | 25 | 25 |
| Evaluation | | Viscosity (mPa·s) | 230 | 220 | 260 | 300 | 420 | 220 | 200 | 220 |
| | | Dischargeability | Δ | Δ | Δ | Δ | Δ | Δ | Δ | ○ |
| | | Wet spreading | ○ | ○ | ○ | ○ | ○ | ○ | ○ | ○ |
| | | Unevenness in cured product film | ○○ | ○○ | ○○ | ○○ | ○○ | ○○ | ○○ | ○○ |
| | | Heat resistance | ○○ | ○○ | ○○ | ○○ | ○○ | ○○ | ○○ | ○○ |
| | | Storage stability | Δ | Δ | Δ | Δ | Δ | Δ | Δ | Δ |
| | | Insulation reliability (Migration resistance/Insulation resistance) | Δ | Δ | Δ | Δ | Δ | ○ | Δ | Δ |

| | | | Ex. 9 | Ex. 10 | Ex. 11 | Ex. 12 | Comp. Ex. 1 | Comp. Ex. 2 |
|---|---|---|---|---|---|---|---|---|
| Blending ingredient (part by weight) | Compound (A) | Glycidyl methacrylate | | | | | | |
| | | Glycidyl acrylate | 5 | 5 | 30 | 30 | | 10 |
| | | 3,4-epoxycyclohexylmethyl acrylate | | | | | | |
| | | 4-hydroxybutyl acrylate glycidyl ether | | | | | | |
| | | UVACURE 1561 | | | | | | |
| | Compound (B) | EBECRYL 3700 | 25 | 25 | 13 | 10 | 20 | 20 |
| | | Triethylene glycol diacrylate | 35 | 30 | 20 | 20 | 30 | 30 |
| | | Isobornyl acrylate | 25 | 25 | 12 | 10 | 20 | 20 |
| | | IRR214-K | | | | | | |
| | Photopolymerization initiator (C) | Irgacure 907 | 4 | 4 | 4 | 4 | 4 | 4 |
| | | Irgacure 369 | | | | | | |
| | | Irgacure 379EG | | | | | | |
| | | TPO | | | | | | |
| | | Irgacure 184 | | | | | | |
| | Compound (D) | jER828 | 5 | 10 | 20 | 25 | 15 | |
| | | jER806 | | | | | | |
| | Potential curing agent (E) | DICY7 | 1 | 1 | 1 | 1 | 1 | 1 |
| | | Reaction viscous product obtained in Synthesis Example 1 | | | | | | |
| | | Reaction viscous product obtained in Synthesis Example 2 | | | | | | |
| | | Reaction viscous product obtained in Synthesis Example 3 | | | | | | |
| | | SDH | | | | | | |
| Total content (% by weight) of compound (A) and compound (D) in 100% by weight of curable composition for inkjet | | | 10 | 15 | 50 | 55 | 15 | 10 |
| Evaluation | | Viscosity (mPa·s) | 280 | 450 | 180 | 200 | — | — |
| | | Dischargeability | Δ | Δ | Δ | Δ | — | — |
| | | Wet spreading | ○ | ○ | ○ | ○ | — | — |
| | | Unevenness in cured product film | ○○ | ○○ | ○○ | ○ | x | ○○ |
| | | Heat resistance | ○ | ○○ | ○○ | ○○ | ○○ | x |
| | | Storage stability | Δ | Δ | Δ | Δ | Δ | Δ |
| | | Insulation reliability (Migration resistance/Insulation resistance) | Δ | Δ | Δ | Δ | Δ | Δ |

TABLE 3

| | | | Ex. 13 | Ex. 14 | Ex. 15 | Ex. 16 | Ex. 17 | Ex. 18 | Ex. 19 | Ex. 20 |
|---|---|---|---|---|---|---|---|---|---|---|
| Blending ingredient | Compound (A) | Glycidyl methacrylate | 10 | | | | | | | |
| | | Glycidyl acrylate | | 10 | | | | 10 | 10 | 5 |

TABLE 3-continued

|  |  |  |  |  |  |  |  |  |  |
|---|---|---|---|---|---|---|---|---|---|
| (part by weight) |  | 3,4-epoxycyclohexylmethyl acrylate |  |  | 10 |  |  |  |  |
|  |  | 4-hydroxybutyl acrylate glycidyl ether |  |  |  | 10 |  |  |  |
|  |  | UVACURE 1561 |  |  |  |  | 10 |  |  |
|  | Compound (B) | EBECRYL 3700 | 20 | 20 | 20 | 20 | 20 | 20 | 20 | 25 |
|  |  | Triethylene glycol diacrylate | 30 | 30 | 30 | 30 | 30 | 30 | 30 | 35 |
|  |  | Isobornyl acrylate | 20 | 20 | 20 | 20 | 20 | 20 | 20 | 25 |
|  |  | IRR214-K |  |  |  |  |  |  |  |  |
|  | Photopoly-merization initiator (C) | Irgacure 907 |  |  |  |  |  |  |  |  |
|  |  | Irgacure 369 | 4 | 4 | 4 | 4 | 4 | 4 | 4 | 4 |
|  |  | Irgacure 379EG |  |  |  |  |  |  |  |  |
|  |  | TPO |  |  |  |  |  |  |  |  |
|  |  | Irgacure 184 |  |  |  |  |  |  |  |  |
|  |  | jER828 | 15 | 15 | 15 | 15 | 15 |  | 15 | 5 |
|  |  | jER806 |  |  |  |  |  | 15 |  |  |
|  |  | DICY7 | 1 | 1 | 1 | 1 | 1 | 1 |  | 1 |
|  | Potential curing agent (E) | Reaction viscous product obtained in Synthesis Example 1 |  |  |  |  |  |  |  |  |
|  |  | Reaction viscous product obtained in Synthesis Example 2 |  |  |  |  |  |  |  |  |
|  |  | Reaction viscous product obtained in Synthesis Example 3 |  |  |  |  |  |  |  |  |
|  |  | SDH |  |  |  |  |  |  | 1 |  |
| Total content (% by weight) of compound (A) and compound (D) in 100% by weight of curable composition for inkjet |  |  | 25 | 25 | 25 | 25 | 25 | 25 | 25 | 10 |
| Evaluation | Viscosity (mPa · s) |  | 230 | 220 | 260 | 300 | 420 | 200 | 220 | 280 |
|  | Dischargeability |  | Δ | Δ | Δ | Δ | Δ | Δ | ○ | Δ |
|  | Wet spreading |  | ○ | ○ | ○ | ○ | ○ | ○ | ○ | ○ |
|  | Unevenness in cured product film |  | ○○ | ○○ | ○○ | ○○ | ○○ | ○○ | ○○ | ○○ |
|  | Heat resistance |  | ○○ | ○○ | ○○ | ○○ | ○○ | ○○ | ○○ | ○ |
|  | Storage stability |  | Δ | Δ | Δ | Δ | Δ | Δ | Δ | Δ |
|  | Insulation reliability (Migration resistance/Insulation resistance) |  | ○ | ○ | ○ | ○ | ○ | ○ | ○ | ○ |

|  |  |  | Ex. 21 | Ex. 22 | Ex. 23 | Ex. 24 | Ex. 25 | Ex. 26 |
|---|---|---|---|---|---|---|---|---|
| Blending ingredient (part by weight) | Compound (A) | Glycidyl methacrylate |  |  |  | 10 | 10 | 10 |
|  |  | Glycidyl acrylate | 5 | 30 | 30 |  |  |  |
|  |  | 3,4-epoxycyclohexylmethyl acrylate |  |  |  |  |  |  |
|  |  | 4-hydroxybutyl acrylate glycidyl ether |  |  |  |  |  |  |
|  |  | UVACURE 1561 |  |  |  |  |  |  |
|  | Compound (B) | EBECRYL 3700 | 25 | 13 | 10 | 20 | 20 | 20 |
|  |  | Triethylene glycol diacrylate | 30 | 20 | 20 | 30 | 30 | 30 |
|  |  | Isobornyl acrylate | 25 | 12 | 10 | 20 | 20 | 20 |
|  |  | IRR214-K |  |  |  |  |  |  |
|  | Photopoly-merization initiator (C) | Irgacure 907 |  |  |  |  |  |  |
|  |  | Irgacure 369 | 4 | 4 | 4 |  |  |  |
|  |  | Irgacure 379EG |  |  |  | 4 |  |  |
|  |  | TPO |  |  |  |  | 4 |  |
|  |  | Irgacure 184 |  |  |  |  |  | 4 |
|  |  | jER828 | 10 | 20 | 25 | 15 | 15 | 15 |
|  |  | jER806 |  |  |  |  |  |  |
|  |  | DICY7 | 1 | 1 | 1 | 1 | 1 | 1 |
|  | Potential curing agent (E) | Reaction viscous product obtained in Synthesis Example 1 |  |  |  |  |  |  |
|  |  | Reaction viscous product obtained in Synthesis Example 2 |  |  |  |  |  |  |
|  |  | Reaction viscous product obtained in Synthesis Example 3 |  |  |  |  |  |  |
|  |  | SDH |  |  |  |  |  |  |
| Total content (% by weight) of compound (A) and compound (D) in 100% by weight of curable composition for inkjet |  |  | 15 | 50 | 55 | 25 | 25 | 25 |
| Evaluation | Viscosity (mPa · s) |  | 450 | 180 | 200 | 230 | 230 | 230 |
|  | Dischargeability |  | Δ | Δ | Δ | Δ | Δ | Δ |
|  | Wet spreading |  | ○ | ○ | ○ | ○ | ○ | ○ |
|  | Unevenness in cured product film |  | ○○ | ○○ | ○ | ○○ | ○○ | ○○ |
|  | Heat resistance |  | ○○ | ○○ | ○○ | ○○ | ○○ | ○○ |
|  | Storage stability |  | Δ | Δ | Δ | Δ | Δ | Δ |
|  | Insulation reliability (Migration resistance/Insulation resistance) |  | ○ | ○ | ○ | ○ | Δ | Δ |

TABLE 4

|  |  |  | Ex. 27 | Ex. 28 | Ex. 29 | Ex. 30 | Ex. 31 | Ex. 32 | Ex. 33 | Ex. 34 | Ex. 35 |
|---|---|---|---|---|---|---|---|---|---|---|---|
| Blending ingredient (part by weight) | Compound (A) | Glycidyl methacrylate | 10 |  |  |  |  |  |  |  |  |
|  |  | Glycidyl acrylate |  | 10 |  |  |  |  | 10 | 10 | 5 | 5 |
|  |  | 3,4-epoxycyclohexylmethyl acrylate |  |  | 10 |  |  |  |  |  |  |
|  |  | 4-hydroxybutyl acrylate glycidyl ether |  |  |  | 10 |  |  |  |  |  |
|  |  | UVACURE 1561 |  |  |  |  | 10 |  |  |  |  |

TABLE 4-continued

| | | | | | | | | | | | |
|---|---|---|---|---|---|---|---|---|---|---|---|
| | Compound (B) | EBECRYL 3700 | 20 | 20 | 20 | 20 | 20 | 20 | 20 | 25 | 25 |
| | | Triethylene glycol diacrylate | 30 | 30 | 30 | 30 | 30 | 30 | 30 | 35 | 30 |
| | | Isobornyl acrylate | 20 | 20 | 20 | 20 | 20 | 20 | 20 | 25 | 25 |
| | | IRR214-K | | | | | | | | | |
| | Photopoly- merization initiator (C) | Irgacure 907 | 4 | 4 | 4 | 4 | 4 | | 4 | 4 | 4 |
| | | Irgacure 369 | | | | | | 4 | | | |
| | | Irgacure 379EG | | | | | | | | | |
| | | TPO | | | | | | | | | |
| | | Irgacure 184 | | | | | | | | | |
| | Compound (D) | jER828 | 15 | 15 | 15 | 15 | 15 | 15 | | 5 | 10 |
| | | jER806 | | | | | | | 15 | | |
| | Potential curing agent (E) | DICY7 | | | | | | | | | |
| | | Reaction viscous product obtained in Synthesis Example 1 | 1 | 1 | 1 | 1 | 1 | 1 | 1 | 1 | 1 |
| | | Reaction viscous product obtained in Synthesis Example 2 | | | | | | | | | |
| | | Reaction viscous product obtained in Synthesis Example 3 | | | | | | | | | |
| | | SDH | | | | | | | | | |
| Total content (% by weight) of compound (A) and compound (D) in 100% by weight of curable composition for inkjet | | | 25 | 25 | 25 | 25 | 25 | 25 | 25 | 10 | 15 |
| Evaluation | Viscosity (mPa·s) | | 230 | 220 | 260 | 300 | 420 | 220 | 200 | 280 | 450 |
| | Dischargeability | | ○○ | ○○ | ○○ | ○○ | ○○ | ○○ | ○○ | ○○ | ○○ |
| | Wet spreading | | ○ | ○ | ○ | ○ | ○ | ○ | ○ | ○ | ○ |
| | Unevenness in cured product film | | ○○ | ○○ | ○○ | ○○ | ○○ | ○○ | ○○ | ○○ | ○○ |
| | Heat resistance | | ○○ | ○○ | ○○ | ○○ | ○○ | ○○ | ○○ | ○ | ○○ |
| | Storage stability | | ○ | ○ | ○ | ○ | ○ | ○ | ○ | ○ | ○ |
| | Insulation reliability (Migration resistance/Insulation resistance) | | ○ | ○ | ○ | ○ | ○ | ○ | ○ | ○ | ○ |

| | | | Ex. 36 | Ex. 37 | Ex. 38 | Ex. 39 | Ex. 40 | Ex. 41 | Ex. 42 | Ex. 43 |
|---|---|---|---|---|---|---|---|---|---|---|
| Blending ingredient (part by weight) | Compound (A) | Glycidyl methacrylate | | | 10 | 10 | 10 | | | 10 |
| | | Glycidyl acrylate | 30 | 30 | | | | | | |
| | | 3,4-epoxycyclohexylmethyl acrylate | | | | | | | | |
| | | 4-hydroxybutyl acrylate glycidyl ether | | | | | | | | |
| | | UVACURE 1561 | | | | | | 15 | 15 | |
| | Compound (B) | EBECRYL 3700 | 13 | 10 | 20 | 20 | 20 | 20 | 25 | 20 |
| | | Triethylene glycol diacrylate | 20 | 20 | 30 | 30 | 30 | 35 | 30 | |
| | | Isobornyl acrylate | 12 | 10 | 20 | 20 | 20 | 10 | 10 | 20 |
| | | IRR214-K | | | | | | | | 30 |
| | Photopoly- merization initiator (C) | Irgacure 907 | 4 | 4 | 4 | 4 | | 4 | 4 | |
| | | Irgacure 369 | | | | | 4 | | | 4 |
| | | Irgacure 379EG | | | | | | | | |
| | | TPO | | | | | | | | |
| | | Irgacure 184 | | | | | | | | |
| | Compound (D) | jER828 | 20 | 25 | 15 | 15 | 15 | 15 | 15 | 15 |
| | | jER806 | | | | | | | | |
| | Potential curing agent (E) | DICY7 | | | | | | | | |
| | | Reaction viscous product obtained in Synthesis Example 1 | 1 | 1 | | | | 1 | 1 | 1 | 1 |
| | | Reaction viscous product obtained in Synthesis Example 2 | | | 1 | | | | | |
| | | Reaction viscous product obtained in Synthesis Example 3 | | | | 1 | | | | |
| | | SDH | | | | | | | | |
| Total content (% by weight) of compound (A) and compound (D) in 100% by weight of curable composition for inkjet | | | 50 | 55 | 25 | 25 | 25 | 30 | 30 | 25 |
| Evaluation | Viscosity (mPa·s) | | 180 | 200 | 230 | 230 | 230 | 900 | 1100 | 230 |
| | Dischargeability | | ○○ | ○○ | ○○ | ○○ | ○○ | ○ | Δ | ○○ |
| | Wet spreading | | ○ | ○ | ○ | ○ | ○ | ○○ | ○○ | ○ |
| | Unevenness in cured product film | | ○○ | ○ | ○○ | ○○ | ○○ | ○○ | ○○ | ○○ |
| | Heat resistance | | ○○ | ○○ | ○○ | ○○ | ○○ | ○○ | ○○ | ○○ |
| | Storage stability | | ○ | ○ | ○ | ○ | ○ | ○ | ○ | ○ |
| | Insulation reliability (Migration resistance/Insulation resistance) | | ○ | ○ | ○ | ○ | ○ | ○ | ○ | ○ |

In the curable compositions of Examples 1 to 24 and 27 to 43 in which an α-aminoacetophenone type photopolymerization initiator was used, stickiness of the surface of the primary cured product after light irradiation and before curing was smaller, heat curability at the time of heat curing was more excellent, and the evaluation result of insulation reliability was better, in comparison with the curable compositions of Examples 25 and 26 in which a photopolymerization initiator other than an α-aminoacetophenone type photopolymerization initiator is used.

In Examples 1 to 5 and 7 to 12 where an α-aminoalkylphenone type photoradical polymerization initiator not having a dimethylamino group is used, and in Examples 25 and 26 where a photoradical polymerization initiator other than an α-aminoalkylphenone type photoradical polymerization initiator is used, evaluation results of insulation reliability were "Δ" for every case; however, values of insulation resistance were higher in Examples 1 to 5 and 7 to 12 where an α-aminoalkylphenone type photoradical polymerization initiator not having a dimethylamino group is used than in Examples 25 and 26 where a photoradical polymerization initiator other than an α-aminoalkylphenone type photoradical polymerization initiator is used.

In Examples 13, 27 and 40, evaluation results of insulation reliability (migration resistance) were "○" for every case; however, the value of insulation resistance in Example 40 was higher than the value of insulation resistance in Example 13, and further higher than the value of insulation resistance in Example 27.

In Examples, the following moist heat resistance (heat resistance and moisture resistance) was evaluated.

(8) Moist Heat Resistance (Heat Resistance and Moisture Resistance)

A glass epoxy substrate (100 mm×100 mm) having copper wiring provided on its top face was prepared. On the entire surface of this substrate, a curable composition for inkjet discharged from an inkjet head of a piezo type inkjet printer equipped with a UV illuminator was applied. At the time of conducting the discharge test for a curable composition having a viscosity of 500 mPa·s or less, the head temperature was set at 80° C., and at the time of conducting the discharge test for a curable composition having a viscosity of more than 500 mPa·s, the head temperature was set at 95° C.

The curable composition for inkjet (thickness 20 μm) applied on the substrate was irradiated with an ultraviolet ray having a wavelength of 365 nm so that the irradiation energy was 1000 mJ/cm$^2$, and then heated at 180° C. for 1 hour, to obtain a cured product (thickness 20 μm).

The obtained laminate of the substrate and the cured product was left still for 24 hours in the condition of 130° C. and relative humidity of 85% RH. Then adhesiveness of the cured product to the substrate was examined by a crosscut tape test (JIS 5400 6.15), and moist heat resistance was judged according to the following judging criteria. In the cured product, cuts were made at intervals of 1 mm by means of a cutter to form a grid of 100 cells, and cellophane tape (JIS Z1522) was put onto the cured product having cuts, and one end of the tape was strongly peeled off at an angle of 45 degrees, and the peeling condition was checked.

As a result, in the case of the curable composition of Example 43 containing the multifunctional compound having a polycyclic backbone and having two or more (meth)acryloyl groups (A1-1), the cured product did not peel off when the tape was peeled off. In the cases of the curable compositions of Examples 1 to 42 not containing the multifunctional compound having a polycyclic backbone and having two or more (meth)acryloyl groups (A1-1), the cured product partly or entirely peeled off when the tape was peeled off. In the cases of the curable compositions of Example 1 to 42, the cured product did not peel off before the tape was peeled off.

The invention claimed is:

1. A curable composition for inkjet that is applied by an inkjet method and is able to cure by light irradiation and heat addition, comprising:
   a compound having a (meth)actyloyl group and a cyclic ether group;
   a photoreactive compound not having a cyclic group and having a (meth)acryloyl group;
   a phompolymerization initiator;
   a compound not having a (meth)acryloyi group and having a cyclic ether group; and
   a potential curing agent,
   wherein the compound having a (meth)acryloyl group and a cyclic ether group has one or two (meth)acryloyl groups,
   the compound having a (meth)acryloyl group and a cyclic ether group is at least one selected from the group consisting of glycidyl (meth)acrylate 3,4-epoxycyclohexylmetbyl (meth)acrylate, 4-hydroxybutyl (meth)acrylate glycidyl ether, and a reaction product between an epoxy compound and (meth)acrylic acid, and
   the viscosity at 25° C. measured in conformance with JIS K2283 is 160 mPa·s or more and 1200 mPa·s or less.

2. The curable composition for inkjet according to claim 1, wherein in 100% by weight of the curable composition for inkjet, a total content of the compound having a (meth)acryloyl group and a cyclic ether group and the compound not having a (meth)acrylovi group and having a cyclic ether group is 15% by weight or more and 50% by weight or less.

3. The curable composition for inkjet according to claim 1, wherein the photopolymerization initiator is an α-aminoalkylphenone type photoradical polymerization initiator.

4. The curable compositiye for inkjet according to claim 3, wherein the photopolymerization initiator is an α-aminoalkylphenone type photoradical polymerization initiator having a dimethylamino group.

5. The curable composition for inkjet according to claim 1, wherein the potential curing agent is a reaction viscous product obtained by reacting dicyandiamide with a functional group-containing compound having a functional group capable of reacting with the dicyandiamide.

6. The curable composition for inkjet according, to claim 1 wherein the photoreactiye compound not having a cyclic, group and haying a (meth)acryloyl group includes a multifunctional compound not having a cyclic group, having a polycyclic backbone and having two or more (meth)acryloyl groups.

7. The curable composition for inkjet according to claim 1, wherein the photoreactive compound not having a cyclic group and having a. (meth)acryloyl group includes both a multifunctional compound not having a cyclic group, haying a polycyclic backbone and having one (meth) acryloyl group.

8. The curable composition for inkjet according to claim 1, wherein the photoreactive compound not baying a cyclic gaup and having a (meth)acrylovl group includes both a multifunctional compound not having a cyclic group, having a polycyclic backbone and haying two or more (meth)acryloyl groups, and a monofunctional compound not having a cyclic group, having; a polycyclic backbone and having one (meth)acryloyl group.

9. A method for producing; an electronic component comprising the steps of:
   applying the curable composition for inkjet according to claim 1 by an inkjet method draw a pattern; and
   making the curable composition for inkjet drawn into a pattern cure by light irradiation and heat addition, to form a cured product layer.

10. The method for producing an electronic component according to claim 9, which is a method for producing a printed wiring. board which is an electronic component having a resist pattern,
   wherein the curable composition for inkjet is applied by an inkjet method and drawn into a pattern, and the curable composition for inkjet drawn into a pattern is made to cure by light irradiation and heat addition, to form a resist pattern.

* * * * *